United States Patent
Sim et al.

(10) Patent No.: US 9,601,665 B2
(45) Date of Patent: Mar. 21, 2017

(54) NANOSTRUCTURE SEMICONDUCTOR LIGHT EMITTING DEVICE

(71) Applicant: Samsung Electronics Co., Ltd., Suwon-si, Gyeonggi-do (KR)

(72) Inventors: Sung Hyun Sim, Seoul (KR); Geon Wook Yoo, Seongnam-si (KR); Mi Hyun Kim, Seoul (KR); Dong Hoon Lee, Seoul (KR); Jin Bock Lee, Hwaseong-si (KR); Je Won Kim, Seoul (KR); Hye Seok Noh, Suwon-si (KR); Dong Kuk Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/828,004

(22) Filed: Aug. 17, 2015

(65) Prior Publication Data

US 2016/0049553 A1     Feb. 18, 2016

(30) Foreign Application Priority Data

Aug. 18, 2014  (KR) ........................ 10-2014-0106794

(51) Int. Cl.
  *H01L 33/24* (2010.01)
  *H01L 33/14* (2010.01)
  (Continued)

(52) U.S. Cl.
  CPC .............. *H01L 33/24* (2013.01); *H01L 33/08* (2013.01); *H01L 33/38* (2013.01)

(58) Field of Classification Search
  CPC ......... H01L 33/24; H01L 33/08; H01L 33/14; H01L 33/38
  (Continued)

(56) References Cited

U.S. PATENT DOCUMENTS 6,372,608 B1   4/2002   Shimoda et al.
6,645,830 B2  11/2003   Shimoda et al.
(Continued)

FOREIGN PATENT DOCUMENTS

JP    2009505415 A    2/2009
JP    2012235120 A   11/2012
(Continued)

*Primary Examiner* — Cuong Q Nguyen
*Assistant Examiner* — Tong-Ho Kim
(74) *Attorney, Agent, or Firm* — Harness, Dickey & Pierce, PLC

(57) ABSTRACT

A nanostructure semiconductor light emitting device may includes: a base layer having first and second regions and formed of a first conductivity-type semiconductor material; a plurality of light emitting nanostructures disposed on an upper surface of the base layer, each of which including a nanocore formed of the first conductivity-type semiconductor material, and an active layer and a second conductivity-type semiconductor layer sequentially disposed on the nanocore; and a contact electrode disposed on the plurality of light emitting nanostructures, wherein a tip portion of each of light emitting nanostructures disposed on the first region may not be covered with the contact electrode, and a tip portion of each of light emitting nanostructures disposed on the second region may be covered with the contact electrode.

20 Claims, 11 Drawing Sheets

(51) Int. Cl.
*H01L 33/08* (2010.01)
*H01L 33/38* (2010.01)

(58) Field of Classification Search
USPC .............................................. 257/13; 438/34
See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,404,504 B1 | 3/2013 | Zhu et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,669,125 B2 | 3/2014 | Lowgren |
| 8,735,931 B2 | 5/2014 | Han et al. |
| 8,766,295 B2 | 7/2014 | Kim |
| 2008/0315229 A1 | 12/2008 | Yi et al. |
| 2011/0012168 A1 | 1/2011 | Armitage |
| 2012/0235117 A1 | 9/2012 | Fukui et al. |
| 2012/0276672 A1 | 11/2012 | Wei et al. |
| 2013/0140521 A1 | 6/2013 | Gilet et al. |
| 2013/0292729 A1* | 11/2013 | Nunotani ................ H01L 33/38 257/98 |
| 2014/0117401 A1 | 5/2014 | Herner |
| 2015/0118777 A1* | 4/2015 | Seo ......................... H01L 33/20 438/34 |
| 2015/0144873 A1 | 5/2015 | Hwang et al. |
| 2015/0155432 A1 | 6/2015 | Yoo et al. |

FOREIGN PATENT DOCUMENTS

| | | |
|---|---|---|
| JP | 5227224 B2 | 7/2013 |
| KR | 100668965 B1 | 1/2007 |
| KR | 20110132163 A | 12/2011 |
| KR | 101356701 B1 | 2/2014 |
| KR | 101373152 B1 | 3/2014 |
| KR | 20150061544 A | 6/2015 |
| KR | 20150064413 A | 6/2015 |
| WO | WO-2011067872 A1 | 6/2011 |

\* cited by examiner

NANOSTRUCTURE SEMICONDUCTOR LIGHT EMITTING DEVICE

CROSS-REFERENCE TO RELATED APPLICATION

This application claims the priority to Korean Patent Application No. 10-2014-0106794 filed on Aug. 18, 2014, with the Korean Intellectual Property Office, the disclosure of which is incorporated herein by reference.

TECHNICAL FIELD

The present disclosure relates to a nanostructure semiconductor light emitting device.

BACKGROUND

A semiconductor light emitting device such as a light emitting diode (LED) is a device including a material that emits light, in which energy generated through electron-hole recombination is converted into light to be emitted therefrom. LEDs are commonly used as light sources in lighting devices, display devices, and the like, and the development of LEDs has thus been accelerated.

In recent years, semiconductor light emitting devices using nanostructures and technologies for manufacturing the same have been proposed to improve crystallinity and luminous efficiency. In such a semiconductor light emitting device using nanostructures, the generation of heat may be relatively reduced or prevented and a surface area may be increased due to the use of nanostructures, whereby a light emitting area may be increased to enhance luminous efficiency. In addition, an active layer may be obtained from a non-polar plane or a semi-polar plane, whereby luminous efficiency resulting from polarization may be reduced or prevented and efficiency droop characteristics may be improved.

A portion of an active layer formed on a tip portion of a nanostructure is relatively thin, and therefore has a higher risk of leakage current. However, in a case in which a portion of a contact electrode in contact with the tip portion of the nanostructure is removed in order to solve the aforementioned problem, this may result in an increase in operating voltage of the nanostructure.

SUMMARY

An example embodiment in the present disclosure may provide a nanostructure semiconductor light emitting device having stable light emission characteristics through resolving problems in terms of changes in wavelengths of emitted light, leakage currents, and/or increases in operating voltages, which may occur in tip portions of nanostructures.

According to an example embodiment in the present disclosure, a nanostructure semiconductor light emitting device may include: a base layer having first and second regions and formed of a first conductivity-type semiconductor material; a plurality of light emitting nanostructures disposed on an upper surface of the base layer, each of which including a nanocore formed of the first conductivity-type semiconductor material, and an active layer and a second conductivity-type semiconductor layer sequentially disposed on the nanocore; and a contact electrode disposed on the plurality of light emitting nanostructures, wherein tip portions of light emitting nanostructures disposed on the first region may not be covered with the contact electrode, and tip portions of light emitting nanostructures disposed on the second region may be covered with the contact electrode.

The plurality of light emitting nanostructures disposed on the second region and the contact electrode may include a current blocking layer interposed therebetween.

The current blocking layer may be extended to cover an upper portion of the base layer.

The current blocking layer may be formed of an insulating material including $SiO_2$, $SiN$, $Al_2O_3$, $HfO$, $TiO_2$, or $ZrO$.

The nanostructure semiconductor light emitting device may further include a second electrode disposed on the second region.

The second electrode may be disposed to contact the contact electrode.

The contact electrode may electrically connect the light emitting nanostructures disposed on the first region to the light emitting nanostructures disposed on the second region.

A side surface of the nanocore may have a crystal plane perpendicular to the upper surface of the base layer.

The side surface of the nanocore may be a non-polar plane.

The tip portions of the light emitting nanostructures may have non-planar surfaces, and the tip portions and side surfaces of the light emitting nanostructures may include crystal planes having different polarities.

The nanostructure semiconductor light emitting device may further include an insulating layer disposed on the base layer and having openings, each of which exposing a portion of the base layer, and the nanocore may be disposed on the portion of the base layer exposed through the opening.

The nanostructure semiconductor light emitting device may further include an insulating protective layer filling a space between the plurality of light emitting nanostructures.

The insulating protective layer may be disposed on the first region.

The insulating protective layer may be formed of a material including at least one of $SiO_2$, $SiN_x$, tetraethyl orthosilicate (TEOS), borophosphosilicate glass (BPSG), CVD-$SiO_2$, spin-on glass (SOG), and spin-on dielectric (SOD).

According to another example embodiment in the present disclosure, a nanostructure semiconductor light emitting device may include: a base layer formed of a first conductivity-type semiconductor material; a plurality of light emitting nanostructures disposed on the base layer, each of which including a nanocore formed of the first conductivity-type semiconductor material, and an active layer and a second conductivity-type semiconductor layer sequentially disposed on the nanocore; a contact electrode disposed on the plurality of light emitting nanostructures; a first electrode electrically connected to the base layer; and a second electrode disposed to cover one region of the contact electrode, wherein one region of the contact electrode may cover tip portions of some light emitting nanostructures among the plurality of light emitting nanostructures, and the other region of the contact electrode may expose tip portions of the other light emitting nanostructures among the plurality of light emitting nanostructures.

According to another example embodiment in the present disclosure, a nanostructure semiconductor light emitting device, may comprise: a base layer including first and second regions; a plurality of light emitting nanostructures on an upper surface of the base layer; and a contact electrode on the plurality of light emitting nanostructures, wherein tip portions of a first subset of the plurality of light emitting nanostructures in the first region are not covered with the contact electrode, and tip portions of a second subset of the plurality of light emitting nanostructures in the second region are covered with the contact electrode.

The nanostructure semiconductor light emitting device may further comprise a current blocking layer between the contact electrode and the plurality of light emitting nanostructures in the second region.

The nanostructure semiconductor light emitting device may further comprise a second electrode on the current blocking layer on the plurality of light emitting nanostructures in the second region.

The nanostructure semiconductor light emitting device may further include a second electrode configured to contact the contact electrode.

The nanostructure semiconductor light emitting device may further include a contact electrode covering main portions of both the first subset of the plurality of light emitting nanostructures in the first region and the second subset of the plurality of light emitting nanostructures in the second region.

BRIEF DESCRIPTION OF DRAWINGS

The above and other aspects, features and advantages in the present disclosure will be more clearly understood from the following detailed description taken in conjunction with the accompanying drawings, in which.

DETAILED DESCRIPTION

Figure 1:
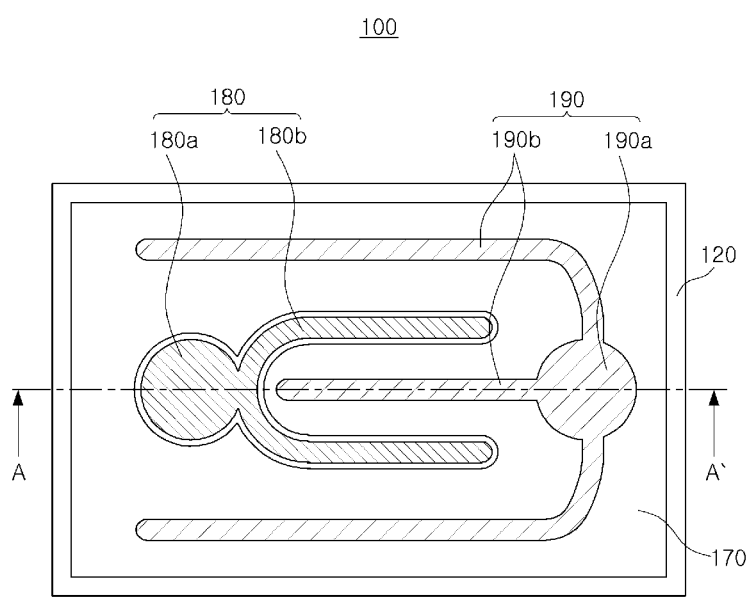
FIG. 1 is a plan view of a nanostructure semiconductor light emitting device according to an example embodiment in the present disclosure.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings.

It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, example embodiments of the inventive concepts are not limited to the specific examples provided herein and are exaggerated for clarity.

The terminology used herein is for the purpose of describing example embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, example embodiments in the detailed description will be described with sectional views as ideal example views of the inventive concepts. Accordingly, shapes of the example views may be modified according to manufacturing techniques and/or allowable errors. Therefore, example embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some example embodiments could be termed a second element in other example embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various example embodiments described herein may be embodied in microelectronic devices such as integrated circuits, wherein a plurality of devices according to various embodiments described herein are integrated in the same microelectronic device. Accordingly, the cross-sectional view (s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view (s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

A nanostructure semiconductor light emitting device 100 according to an example embodiment in the present disclosure is described with reference to FIGS. 1 and 2.

Figure 2:
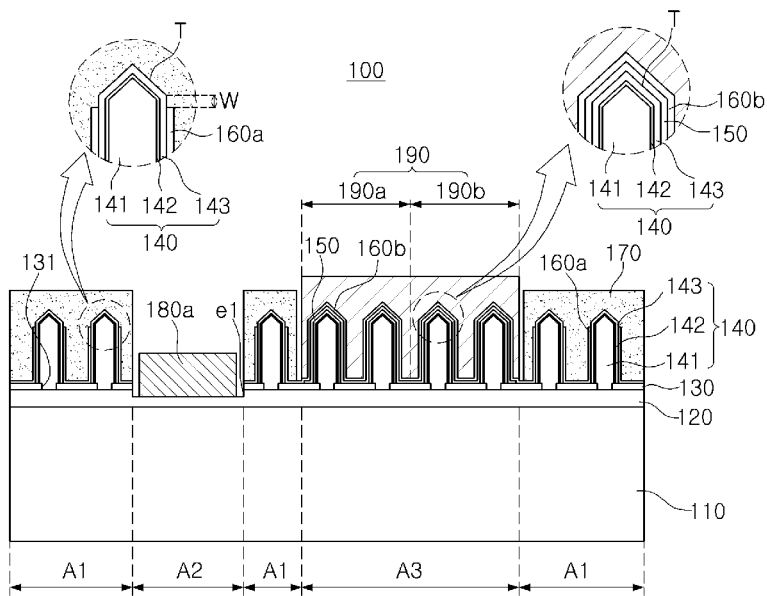
FIG. 2 is a cross-sectional view of the nanostructure semiconductor light emitting device of FIG. 1, taken along line A-A'.

FIG. 1 is a plan view of a nanostructure semiconductor light emitting device according to an example embodiment in the present disclosure, and FIG. 2 is a cross-sectional view of the nanostructure semiconductor light emitting device of FIG. 1, taken along line A-A'. To allow for a better understanding of the device, FIGS. 1 and 2 are illustrated by enlarging or reducing device portions, rather than being to the same scale.

As illustrated in FIGS. 1 and 2, the nanostructure semiconductor light emitting device 100 according to an example embodiment in the present disclosure may include a base layer 120 formed of a first conductivity-type semiconductor material, a plurality of light emitting nanostructures 140 disposed on the base layer 120, and contact electrodes 160a and 160b disposed on surfaces of the plurality of light emitting nanostructures 140.

The base layer 120 may be formed on a substrate 110, and may not only provide a growth surface for the light emitting nanostructures 140 but may also serve to form electrical connections between portions of the light emitting nanostructures 140 having the same polarity.

The base layer 120 may include a first region A1 and second regions A2 and A3. The first region A1 may be defined as a region that receives electrical signals to emit light externally, and the second regions A2 and A3 may be defined as regions that do not emit light externally even when electrical signals are applied thereto. The second regions may include the region A3 having a plurality of light emitting nanostructures but failing to emit light, and the region A2 having no light emitting nanostructures.

The substrate 110 may be an insulating substrate, a conductive substrate, or a semiconductor substrate. For example, the substrate 110 may be formed of sapphire, SiC, Si, $MgAl_2O_4$, MgO, $LiAlO_2$, $LiGaO_2$, or GaN. The base layer 120 may be a nitride semiconductor satisfying $Al_xIn_yGa_{1-x-y}N$ ($0 \le x \le 1$, $0 \le y \le 1$, $0 \le x+y < 1$), and may be doped with impurities to have a particular conductivity-type. For example, the base layer 120 may be doped with n-type impurities such as silicon (Si).

An insulating layer 130 having openings may be formed on the base layer 120 and the openings may be provided to facilitate growth of the light emitting nanostructures 140 (especially, nanocores 141). Portions of the base layer 120 may be exposed through the openings 131, and the nanocores 141 may be formed on the exposed portions of the base layer 120. The insulating layer 130 may be used as a mask for growth of the nanocores 141. The insulating layer 130 may be formed of an insulating material such as $SiO_2$ or $SiN_x$ that may be used in a semiconductor process.

The light emitting nanostructures 140 may each include the nanocore 141 formed of a first conductivity-type semiconductor material and an active layer 142 and a second conductivity-type semiconductor layer 143 sequentially formed on a surface of the nanocore 141.

The active layer 142 may include a multi-quantum well (MQW) structure in which quantum well layers and quantum barrier layers are alternately stacked. For example, in a case in which the active layer 142 is a nitride semiconductor, a GaN/InGaN structure may be used. However, a single quantum well (SQW) structure may also be used. The second conductivity-type semiconductor layer 143 may be a crystal satisfying p-type $Al_xIn_yGa_{1-x-y}N$ ($0 \le x < 1$, $0 \le y < 1$, $0 \le x+y < 1$). The second conductivity-type semiconductor layer 143 may include an electron blocking layer in a portion thereof adjacent to the active layer 142. The electron blocking layer may have a structure in which a plurality of layers having different compositions of n-type $Al_xIn_yGa_{1-x-y}N$ ($0 \le x < 1$, $0 \le y < 1$, $0 \le x+y < 1$) are stacked, or may include one or more layers formed of $Al_yGa_{(1-y)}N$ ($0 \le y < 1$). The electron blocking layer may have a higher band gap than that of the active layer 142, thereby reducing or preventing electrons from flowing to the second conductivity-type semiconductor layer 143.

A tip portion T of the light emitting nanostructure 140 may have a non-planar surface. As illustrated in FIG. 2, according to an example embodiment in the present disclosure, the tip portion of the light emitting nanostructure 140 may have a pyramid shape of which the cross-section is triangular.

Examples of nanocores that may be used in example embodiments are described in more detail with reference to FIGS. 4A and 4B.

Figure 4A:
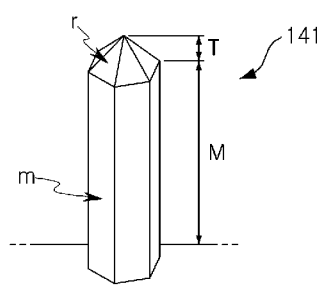
FIGS. 4A and 4B are perspective views illustrating examples of a nanocore used in example embodiments in the present disclosure.

The nanocore 141 illustrated in FIG. 4A may be divided, into a main portion M providing side surfaces, each of which is a first crystal plane, and a tip portion T providing surfaces, each of which is a second crystal plane different from the first crystal plane, in a growth direction.

In a case in which the nanocore 141 has a hexagonal crystal structure such as a nitride single crystal, the first crystal plane may be a non-polar plane (e.g. an m-plane) and the second crystal plane may be a semi-polar plane (e.g. an r-plane). The nanocore 141 may have a rod structure in which the tip portion T is of a hexagonal pyramid shape.

Even in a case in which the active layer is grown on the surface of the nanocore 141 using the same process, the compositions of portions of the active layer (for example, a content of indium (In) in a case of growth of an InGaN layer) may differ due to differences in characteristics of the respective crystal planes, and a wavelength of light generated in the active layer grown on the r-plane of the tip portion T of the nanocore 141 may be different from a wavelength of light generated in the active layer grown on the m-plane of the side surface of the nanocore 141. This may result in increasing dispersion of wavelengths of emitted light and difficulties in producing light having a desired wavelength.

In example embodiments, a portion of the contact electrode in contact with the tip portion of the light emitting nanostructure may be removed to reduce or prevent a portion of the active layer disposed on the tip portion T of the nanocore from emitting light. Therefore, the removal of the portion of the contact electrode in contact with the tip portion of the light emitting nanostructure may reduce or prevent the dispersion of wavelengths of emitted light and the leakage current, thereby improving luminous efficiency. Also, the wavelength of light may be designed precisely by allowing the portion of the active layer disposed on the tip portion of the nanocore to not be involved in emitting light. Moreover, since the tip portion of the light emitting nanostructure is exposed, at least a portion of light generated in one light emitting nanostructure may be emitted upwardly prior to being multiply reflected or absorbed by the contact electrode disposed on adjacent light emitting nanostructures, and thus, the amount of light emitted therefrom may be increased.

The removal of the portion of the contact electrode in contact with the tip portion of the light emitting nanostructure as described above may be applied to other nanocores having various crystal structures and forms different from those of the nanocore illustrated in FIG. 4A, as long as tip portions and side surfaces of the other nanocores have different crystal planes. For example, it may be applied in a similar manner to light emitting nanostructures, each of which includes a nanocore having a tip portion which is not formed of a semi-polar plane, as illustrated in FIG. 4B.

Figure 4B:
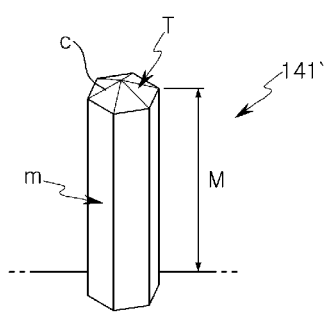

As illustrated in FIG. 4B, a nanocore 141', similarly to the nanocore illustrated in FIG. 4A, may have a main portion M providing side surfaces, each of which is a first crystal plane m. The nanocore 141' may have a tip portion T providing surfaces, each of which is a second crystal plane c different from the first crystal plane m, but the second crystal plane c may not be completely semi-polar.

In the aforementioned structure of the nanocore 141', the compositions or thicknesses of portions of an active layer grown thereon may differ due to differences in characteristics of respective crystal planes, which may cause a leakage current and differences in wavelengths of light emitted therefrom. By removing a portion of the contact electrode disposed on the tip portion T of the nanocore 141' in the same manner as illustrated in FIG. 4A, a current may be reduced or prevented from flowing to the active layer 142 on the tip portion T of the nanocore 141'. As a result, the leakage current and the differences in the wavelengths of light may be resolved, whereby a higher efficiency nanostructure semiconductor light emitting device may be provided.

On the other hand, the removal of a portion of the contact electrode 160a in contact with the tip portion T of the light emitting nanostructure 140 may reduce or prevent an area of the contact electrode 160a, causing an increase in operating voltage of the light emitting nanostructure 140 and an increase in contact resistance of the contact electrode 160a.

In example embodiments, portions of the contact electrodes in contact with the tip portions T of some of the light emitting nanostructures 140 may be removed selectively, depending on whether the light emitting nanostructures 140 are disposed on the first region or the second region.

The contact electrodes 160a and 160b are detailed below.

The contact electrodes 160a and 160b may be disposed on the surfaces of the light emitting nanostructures 140. The contact electrodes 160a and 160b may be formed of an ohmic contact material having ohmic contact with the second conductivity-type semiconductor layer 143. For example, the contact electrodes 160a and 160b may include at least one of Ag, Ni, Al, Rh, Pd, Ir, Ru, Mg, Zn, Pt, and Au, and may be provided as a single- or multiple-layer structure. Alternatively, the contact electrodes 160a and 160b may include a transparent electrode material such as ITO. As necessary, ZnO or graphene may be used therefor.

The nanostructure semiconductor light emitting device 100 according to the present example embodiment may include the contact electrodes 160a and 160b disposed on the surfaces of the light emitting nanostructures 140. As illustrated in FIG. 2, the contact electrodes 160a and 160b may be disposed on the surfaces of the light emitting nanostructures 140; however, the contact electrodes 160a and 160b may have different shapes, respectively, depending on whether the light emitting nanostructures 140 are disposed on the first region A1 or the second region A3.

The contact electrode 160a may only be formed on the side surfaces of the light emitting nanostructures 140 disposed on the first region A1 while not being formed on the tip portions T of the light emitting nanostructures 140. Here, the top of the contact electrode 160a disposed on the side surfaces of the light emitting nanostructures 140 may be spaced apart from the tip portions T of the light emitting nanostructures 140 by a predetermined and/or desired interval W, in consideration of manufacturing tolerance.

By removing portions of the contact electrode from the tip portions T of the light emitting nanostructures 140, the concentration of leakage current on the tip portions T of the light emitting nanostructures 140 may be resolved. However, a reduction in contact area between the contact electrode 160a and a second electrode 190 electrically connected to the contact electrode may cause increases in contact resistance and the operating voltage of the light emitting nanostructures 140.

In example embodiments, in the nanostructure semiconductor light emitting device according to the present example embodiment, the contact electrode 160b may be formed to cover the tip portions T of the light emitting nanostructures 140 disposed on the second region A3, thereby increasing the contact area with the second electrode 190 electrically connected to the contact electrode. Thus, the contact resistance between the contact electrode 160b and the second electrode 190 may be reduced or prevented and the operating voltage of the light emitting nanostructure 140 may be lowered. Also, since the light emitting nanostructures 140 disposed in the second region A3 are not capable of emitting light, an increase in dispersion of emitted light wavelengths may not occur even in a case in which the contact electrode 160b is formed on the tip portions T of the light emitting nanostructures 140.

The following measurement results were listed in table 1 by comparing a comparative example EF in which the contact electrode is formed on both the tip portion and the side surface of the light emitting nanostructure, a comparative example EP in which the contact electrode is only formed on the side surface of the light emitting nanostructure, and an inventive example SEP:

TABLE 1

|  | EF | EP | SEP |
|---|---|---|---|
| Increase in Operating Voltage | 0 | +0.8 V | 0 |
| Reverse Leakage Current | 0 | −53% | −74% |
| Permitted Current | 65 mA | 120 mA | 120 mA |
| Wavelength Change | 0 | −66% | −28% |
| Light Output | 0 | +35% | +8.3% |

It can be seen that the problem of increasing operating voltage in comparative example EP in which the contact electrode is only formed on the side surface of the light emitting nanostructure was resolved in inventive example SEP, and the reverse leakage current in inventive example SEP was reduced by 21% as compared to comparative example EP.

A current blocking layer 150 may be interposed between the plurality of light emitting nanostructures 140 disposed on the second region A3 and the contact electrode 160b. The current blocking layer 150 may include an insulation material such as $SiO_2$, SiN, $Al_2O_3$, HfO, $TiO_2$, or ZrO, and may block the flow of current between the light emitting nanostructures 140 disposed on the second region A3 and the contact electrode 160b, thereby reducing or preventing the active layers 142 of the corresponding light emitting nanostructures 140 from emitting light.

Figure 3:
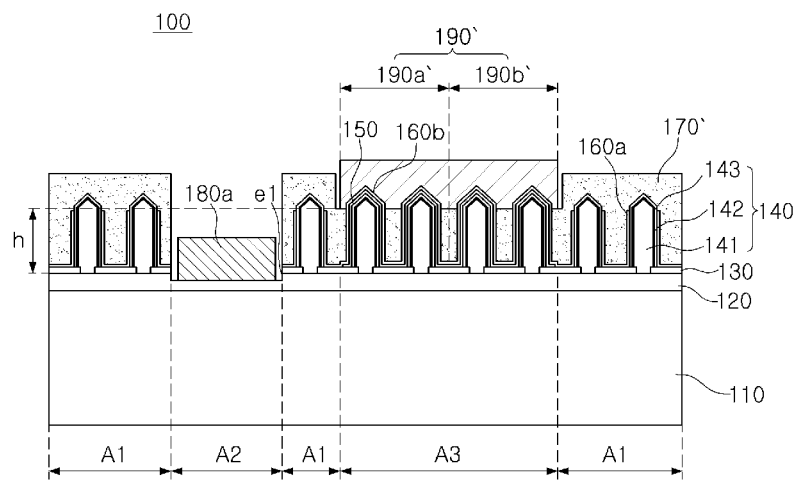
FIG. 3 is a cross-sectional view of a nanostructure semiconductor light emitting device according to a modified example embodiment in the present disclosure.

An insulating protective layer 170 may be formed on the upper surfaces of the light emitting nanostructures 140 as a passivation layer. Such an insulating protective layer 170 may reduce or prevent undesired exposure of portions of the light emitting nanostructures 140, such as the active layer 142, and protect the light emitting nanostructures 140. The insulating protective layer 170 may be formed to have a uniform thickness on the light emitting nanostructures 140 disposed on the first region A1. Alternatively, as illustrated in FIG. 3, an insulating protective layer 170' may be provided in a modified form, with a height h corresponding to the height of the side surface of the light emitting nanostructures 140, thereby covering the side surfaces, other than the tip portions, of the light emitting nanostructures 140 disposed on the second region A3. As illustrated in FIG. 3, in the case in which the insulating protective layer 170' is formed to cover the side surfaces of the light emitting nanostructures 140 disposed on the second region A3, breakage of the light emitting nanostructures 140 may be reduced or prevented during the manufacturing process.

The insulating protective layer may be formed of an electrical insulating material that may be used as a passivation in a semiconductor manufacturing process. Such an insulating protective layer may include a material capable of filling a space between the plurality of light emitting nanostructures 140, such as $SiO_2$, $SiN_x$, tetraethyl orthosilicate (TEOS), borophosilicate glass (BPSG), $CVD-SiO_2$, spin-on glass (SOG), and spin-on dielectric (SOD).

As illustrated in FIG. 1, the nanostructure semiconductor light emitting device 100 may include a first electrode 180 and a second electrode 190. Also, as illustrated in FIG. 2, the first electrode 180 may be disposed in the second region A2 in which a portion of the base layer 120 formed of the first conductivity-type semiconductor material is exposed, and the second electrode 190 may be disposed in the second region A3 in which the upper portion of the contact electrode 160b is exposed.

In FIG. 1, the first electrode 180 and the second electrode 190 are illustrated as including pad portions 180a and 190a and one or more finger portions 180b and 190b extending from the pad portions 180a and 190a, respectively; however, the first electrode 180 and the second electrode 190 are not limited thereto.

The nanostructure semiconductor light emitting device 100 having the aforementioned novel structure may be obtained by using various manufacturing methods. FIGS. 5A to 5H are views illustrating a method of manufacturing the nanostructure semiconductor light emitting device of FIG. 1.

Figure 5A:
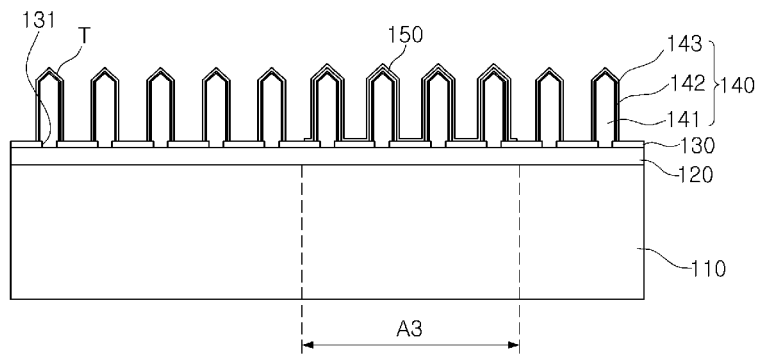
FIGS. 5A to 5H are views illustrating a method of manufacturing the nanostructure semiconductor light emitting device of FIG. 1.

As illustrated in FIG. 5A, the insulating layer 130 may be formed as a mask on the base layer 120 formed of a first conductivity-type semiconductor material, and the plurality of light emitting nanostructures 140 may be formed on the base layer 120.

The base layer 120 may be formed on the substrate 110, and may not only provide a crystal growth surface for the light emitting nanostructures 140, but may also be provided as a structure for electrical connections between portions of the light emitting nanostructures 140 having the same polarity. Thus, the base layer 120 may be formed as a semiconductor single crystal having electrical conductivity. In a case in which the base layer 120 is grown directly, the substrate 110 may be a crystal growth substrate.

The base layer 120 may be a nitride semiconductor satisfying $Al_xIn_yGa_{1-x-y}N$ ($0\leq x<1$, $0\leq y<1$, $0\leq x+y<1$), and may be doped with n-type impurities such as Si. In this case, the substrate 110 may be formed of sapphire, SiC, Si, $MgAl_2O_4$, MgO, $LiAlO_2$, $LiGaO_2$, or GaN.

The insulating layer 130 may include a plurality of openings 131 through which portions of the base layer 120 may be exposed. By forming the plurality of openings 131 after depositing an insulating material on the base layer 120, the insulating layer 130 may expose the portions of the base layer 120. The insulating layer 130 may be formed of an insulating material such as $SiO_2$ or $SiN_x$. The size of the opening 131 may be determined in consideration of a desired size of the nanocore to be grown therein. For example, the diameter of the opening 131 may be 500 nm or less, or more specifically, 200 nm. When viewed from above, the shapes and arrangements of the openings 131 may be varied. For example, the shapes of the openings 131 may be polygonal, quadrangular, elliptical, or circular.

The nanocores 141 may be obtained by selectively growing a first conductivity-type semiconductor material using the insulating layer 130 as a mask. The first conductivity-type semiconductor material of the nanocore 141 may be an n-type nitride semiconductor, and for example, may be a crystal satisfying n-type $Al_xIn_yGa_{1-x-y}N$ ($0\leq x<1$, $0\leq y<1$, $0\leq x+y<1$). The first conductivity-type semiconductor material forming the nanocores 141 may be the same as the first conductivity-type semiconductor material forming the base layer 120. For example, the base layer 120 and the nanocores 141 may be formed of n-type GaN.

A nitride single crystal forming the nanocores 141 may be formed using metal organic chemical vapor deposition (MOCVD) or molecular beam epitaxy (MBE). The crystal may only be grown on the portions of the base layer 120 exposed through the openings 131, rather than being formed on the insulating layer 130, whereby the nanocores 141 may be formed to have a desired shape. The tip portion T and the side surfaces of the nanocore 141 may have different crystal planes. According to the present example embodiment, the nanocore 141 is illustrated as having a rod shape; however, the shape of the nanocore is not limited thereto. For example, the nanocore may have a polypyramidal shape such as a hexagonal pyramid shape. Such various shapes of the nanocores may be obtained by adjusting growth conditions such as growth temperature, growth pressure, and source gas flow.

The active layer 142 and the second conductivity-type semiconductor layer 143 may be sequentially grown on the surface of each of the nanocores 141. Through the process as described above, each of the light emitting nanostructures 140 may have a core-shell structure in which the first conductivity-type semiconductor is provided as the nanocore 141, and the active layer 142 covering the nanocore 141 and the second conductivity-type semiconductor layer 143 are provided as a shell layer.

The active layer 142 may include a multi-quantum well (MQW) structure in which quantum well layers and quantum barrier layers are alternately stacked. For example, in a case in which the active layer 142 is formed of a nitride semiconductor, a GaN/InGaN structure may be used therefor. Alternatively, a single quantum well (SQW) structure may also be used.

The second conductivity-type semiconductor layer 143 may be a crystal satisfying p-type $Al_xIn_yGa_{1-x-y}N$ ($0 \leq x<1$, $0 \leq y<1$, $0 \leq x+y<1$). The second conductivity-type semiconductor layer 143 may include an electron blocking layer in a portion thereof adjacent to the active layer 142. The electron blocking layer may have a structure in which a plurality of layers having different compositions of n-type $Al_xIn_yGa_{1-x-y}N$ ($0 \leq x<1$, $0 \leq y<1$, $0 \leq x+y<1$) are stacked or may include one or more layers formed of $Al_yGa_{(1-y)}N$ ($0 \leq y<1$), and may include a higher band gap than that of the active layer 142, thereby reducing or preventing electrons from flowing to the second conductivity-type semiconductor layer 143.

The current blocking layer 150 may be further formed on the surfaces of the light emitting nanostructures 140 disposed on the region A3. The region A3 may be used for the disposition of the second electrode in a subsequent process. As described above, the current blocking layer 150 may block the current between the light emitting nanostructures and the contact electrode, thereby reducing or preventing the light emitting nanostructures 140 disposed on the second region A3 from emitting light. The thickness of the current blocking layer 150 may be at least 10 nm, and the current blocking layer 150 may be extended to the upper surface of the insulating layer 130.

Figure 5B:
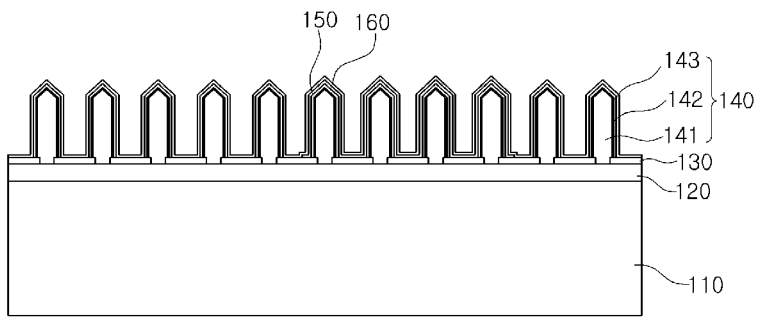

Then, as illustrated in FIG. 5B, a contact electrode 160 may be formed on the surfaces of the light emitting nanostructures 140. In a case in which the current blocking layer 150 is formed in the previous process, the contact electrode 160 may be formed on the surface of the current blocking layer 150. The contact electrode 160 may be formed of a material capable of forming ohmic contact with the second conductivity-type semiconductor layer 143. For example, the contact electrode 160 may include at least one of Ag, Ni, Al, Rh, Pd, Ir, Ru, Mg, Zn, Pt, and Au, and may be provided as a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. Alternatively, the contact electrode 160 may include a transparent electrode material such as ITO. As necessary, graphene may be used therefor.

Figure 5C:
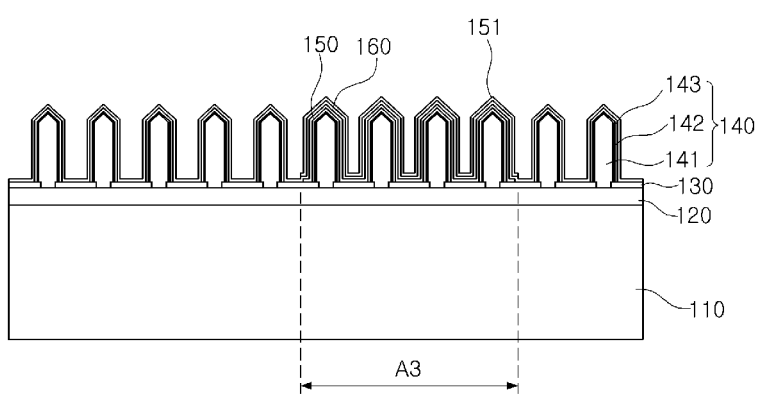

Then, as illustrated in FIG. 5C, an etch stop layer 151 may be formed on the surface of the contact electrode 160 formed on the light emitting nanostructures 140 disposed on the region A3. The etch stop layer 151 may reduce or prevent etching of the upper portions of the contact electrode 160 formed on the light emitting nanostructures 140 disposed on the region A3 in a subsequent process, and may be formed of the same material as that of the current blocking layer 150.

Figure 5D:
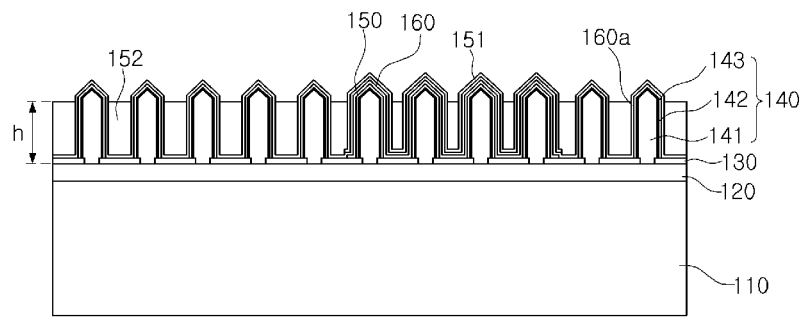

Then, a photoresist may be applied to cover the contact electrode 160 and the etch stop layer 151. As illustrated in FIG. 5D, the photoresist may be etched until the upper portions of the contact electrode 160 and the etch stop layer 151 are exposed. The etching process may be performed through dry etching such as $CF_4$ plasma etching or $O_2$ plasma etching.

Figure 5E:
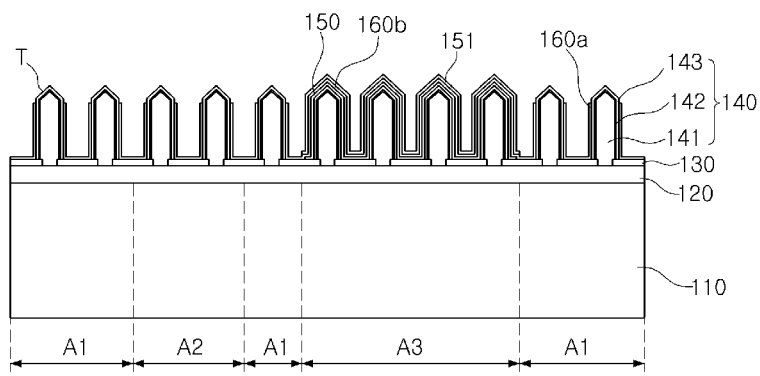

Then, the exposed portion of the contact electrode 160 may be removed, and then the photoresist may be removed. Then, as illustrated in FIG. 5E, the upper portions of the contact electrode 160 formed on the light emitting nanostructures 140 disposed on the first region A1 may be selectively removed, with the contact electrode 160a remaining. Here, the upper portions of the contact electrode 160 formed on the light emitting nanostructures 140 disposed on the second region A2 may also be selectively removed, with the contact electrode 160a remaining. In a case in which the contact electrode 160 is formed of ITO, the upper portions of the contact electrode 160 may be selectively removed using an ITO etchant such as LCE-12K.

The portions of the contact electrode disposed on the tip portions of the light emitting nanostructures 140 may be removed by using the aforementioned selective etching process, exposing the tip portions T of the light emitting nanostructures 140. Therefore, the contact electrode 160a may only be formed on the side surfaces of the light emitting nanostructures 140. Thus, the removal of the contact electrode may expose the second conductivity-type semiconductor layer 143, thereby increasing contact resistance and limiting a current flow. Therefore, the concentration of leakage current on the tip portions of the light emitting nanostructures 140 may be reduced or prevented.

Figure 5F:
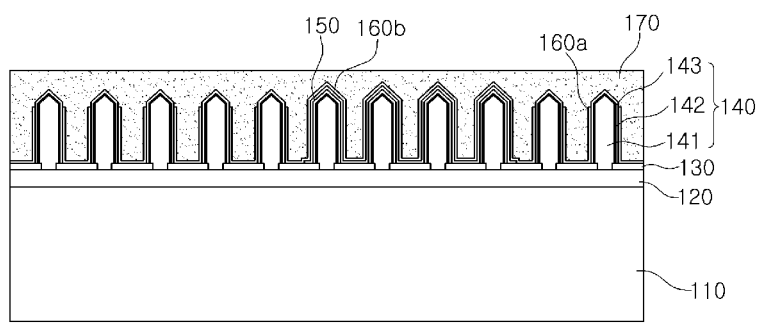

Then, the etch stop layer 151 may be removed, and as illustrated in FIG. 5F, the insulating protective layer 170 may be formed to cover the light emitting nanostructures 140. The etch stop layer 151 may be removed through a chemical etching process. For example, the etch stop layer 151 may be removed through a wet etching process using a buffered oxide etchant (BOE).

The insulating protective layer 170 may be formed of an electrical insulating material that may be used as a passivation in a semiconductor manufacturing process. Such an insulating protective layer may include a material capable of filling the space between the light emitting nanostructures 140, such as $SiO_2$, $SiN_x$, tetraethyl orthosilicate (TEOS), borophosphosilicate glass (BPSG), CVD-$SiO_2$, spin-on glass (SOG), and spin-on dielectric (SOD).

Figure 5G:
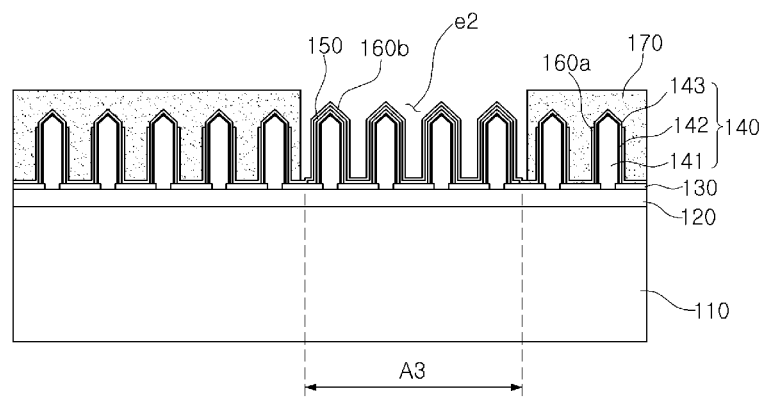

Then, as illustrated in FIG. 5G, a portion of the insulating protective layer 170 may be selectively etched and removed from the region A3, on which the second electrode is to be formed, to thereby define a region e2 which is used for the disposition of the second electrode. The insulating protective layer 170 may be selectively etched through dry etching or wet etching. For example, in a case in which the insulating protective layer 170 is formed of an oxide film or a similar material, CF plasma may be used in the dry etching, and an HF-containing etchant such as BOE may be used in the wet etching.

Figure 5H:
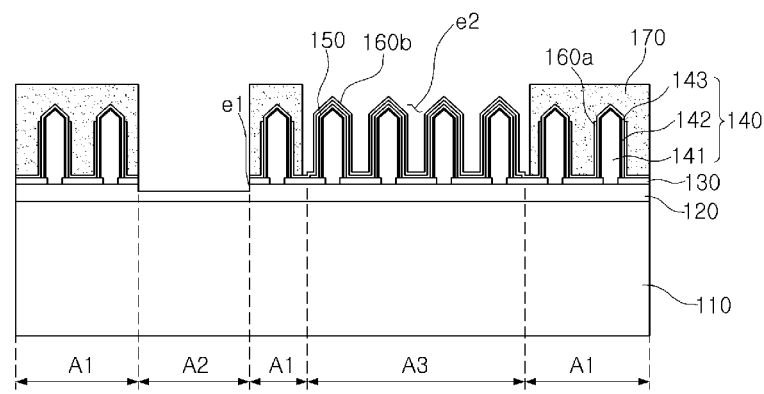

Then, as illustrated in FIG. 5H, a region e1 on which the first electrode is to be formed may be defined. Here, a portion of the base layer 120 may be exposed to define the region e1 on which the first electrode is to be formed.

The exposed region e1 may be used for the disposition of the first electrode. The removing process may be performed using a photolithography process. In this process, some light emitting nanostructures 140 disposed on the exposed region e1 may be removed; however, by not growing any nanocore 141 on the region on which the electrode is to be formed, there is no need to remove the light emitting nanostructures 140.

Then, as illustrated in FIGS. 2 and 5H, the first electrode 180 and the second electrode 190 may be formed on the regions e1 and e2, respectively. In this process, a common electrode material may be used for the first and second electrodes 180 and 190. For example, the material for the first and second electrodes 180 and 190 may include Au, Ag, Al, Ti, W, Cu, Sn, Ni, Pt, Cr, TiW, AuSn, or eutectic metals thereof.

The manufacturing method according to example embodiments in the present disclosure may be modified in various ways. For example, unlike the aforementioned manufacturing method, the contact electrode formed on the tip portions of the light emitting nanostructures 140 may be removed using the insulating protective layer, rather than the use of a separate etch stop layer. FIGS. 6A to 6E are views illustrating a method of a nanostructure semiconductor light emitting device according to another example embodiment in the present disclosure.

The present example embodiment differs from the previous example embodiment in that upper portions of a contact electrode may be removed using an insulating protective layer as a mask, without a separate etch stop layer. Since other features are the same as those in the previous example embodiment, the aforementioned difference is detailed below.

Figure 6A:
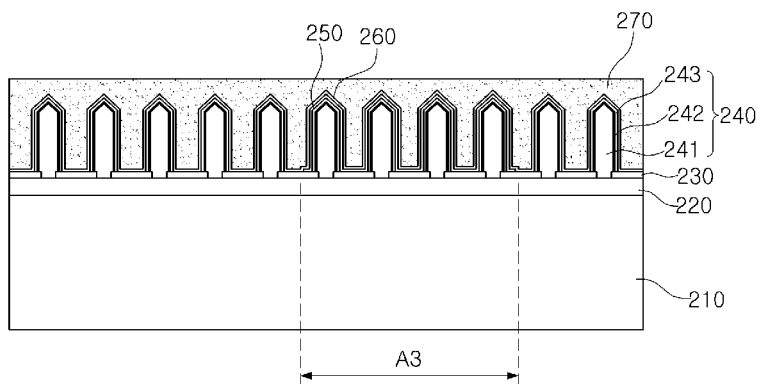
FIGS. 6A to 6E are views illustrating a method of manufacturing a nanostructure semiconductor light emitting device according to another example embodiment in the present disclosure.

As illustrated in FIG. 6A, an insulating layer 230 may be formed as a mask on a base layer 220 formed of a first conductivity-type semiconductor material. A plurality of light emitting nanostructures 240 may be formed on the base layer 220, each of which includes a first conductivity-type semiconductor layer 241, a second conductivity-type semiconductor layer 243, and an active layer 242. A current blocking layer 250 may be further formed on surfaces of light emitting nanostructures 240 disposed on a region A3. A contact electrode 260 may be formed on surfaces of the light emitting nanostructures 240. In a case in which the current blocking layer 250 is formed, the contact electrode 260 may be formed on a surface of the current blocking layer 250. An insulating protective layer 270 may be formed to cover the contact electrode 260. In an example embodiment, a material such as TEOS may be used for the insulating protective layer 270.

Figure 6B:
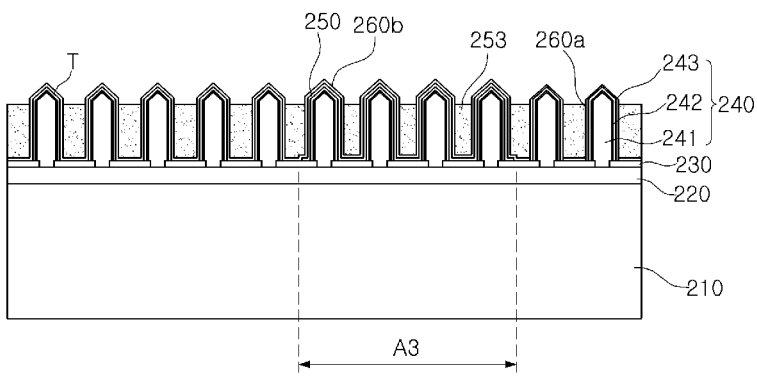

Then, as illustrated in FIG. 6B, a portion of the insulating protective layer 270 may be etched and removed, so that upper portions of the contact electrode 260 disposed on tip portions T of the light emitting nanostructures 240 may be exposed with the contact electrodes 260a and 260b remaining. Such an etching process may be performed through dry etching such as $CF_4$ plasma etching or $O_2$ plasma etching.

Figure 6C:
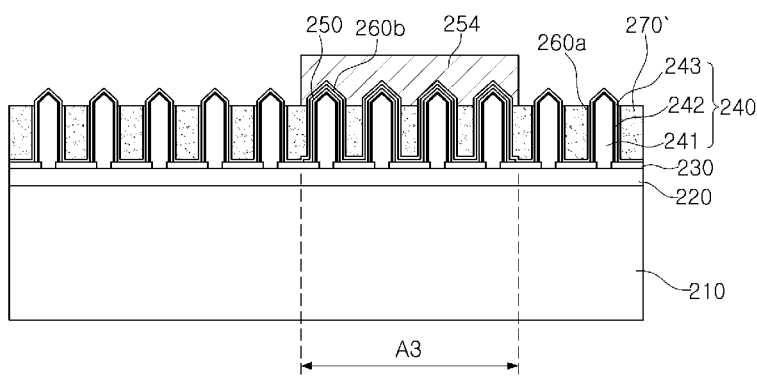

Then, as illustrated in FIG. 6C, a photoresist 254 may be applied to the region A3 on which a second electrode is to be formed, and the upper portions of the contact electrode formed on the tip portions of the light emitting nanostructures disposed on a region A2 may be selectively etched and removed. This selective etching may be performed using an ITO etchant such as LCE-12K.

Figure 6D:
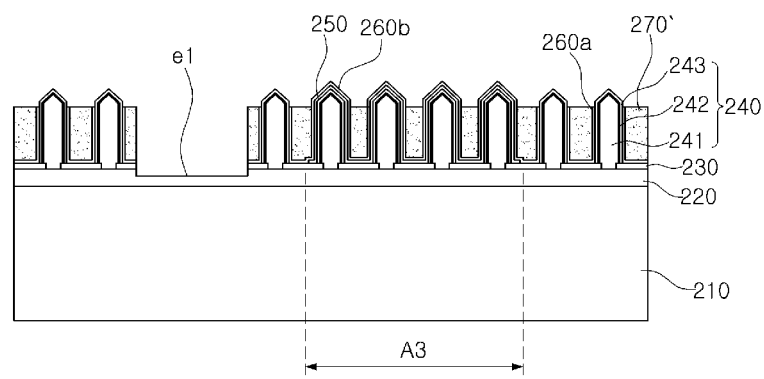

Then, the photoresist 254 may be removed, and as illustrated in FIG. 6D, a region e1 on which a first electrode is to be formed may be defined. In this process, a portion of the base layer 220 may be exposed to define the region e1 on which the first electrode is to be formed.

The exposed region e1 may be used for the disposition of the first electrode. The removing process may be performed using a photolithography process. In this process, some light emitting nanostructures 240 disposed on the exposed region e1 may be removed; however, by not growing any nanocore 241 on the region on which the electrode is to be formed, there is no need to remove the light emitting nanostructures 240.

Figure 6E:
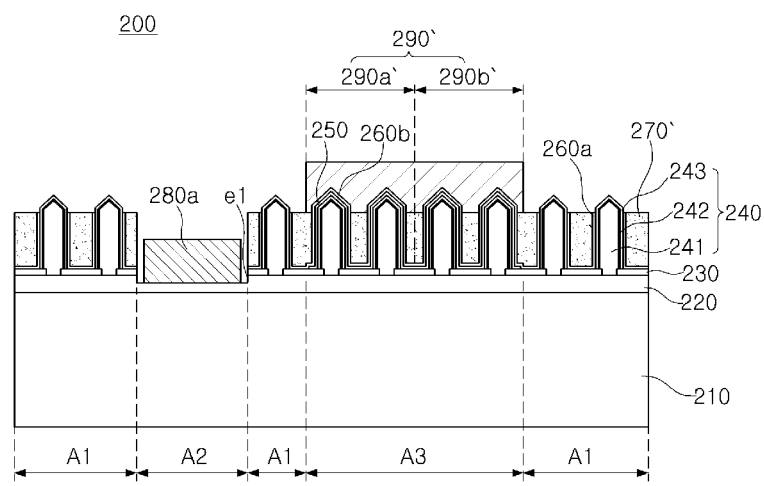

Then, as illustrated in FIG. 6E, a first electrode 280a and a second electrode 290' may be formed on the regions e1 and A3, respectively. In this process, a common electrode material may be used for the first and second electrodes 280a and 290'. For example, the material for the first and second electrodes 280a and 290' may be Au, Ag, Al, Ti, W, Cu, Sn, Ni, Pt, Cr, TiW, AuSn, or eutectic metals thereof.

In the manufacturing method according to an example embodiment, the portions of the contact electrode 260 on the tip portions of the light emitting nanostructures 240 may be selectively removed using the insulating protective layer 270 without the use of a separate etch stop layer, and thus, the manufacturing process may be simplified, as compared with the manufacturing method according to the previous example embodiment.

The nanostructure semiconductor light emitting device according to the above-described example embodiment may be used in various types of package.

Figure 7:
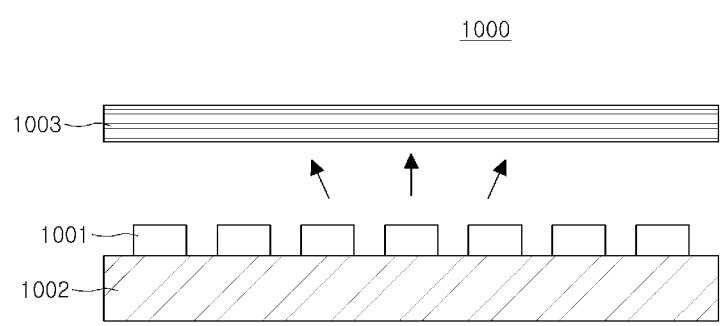
FIG. 7 is a schematic cross-sectional view illustrating an example of a backlight including the nanostructure semiconductor light emitting device of FIG. 1.
Figure 8:
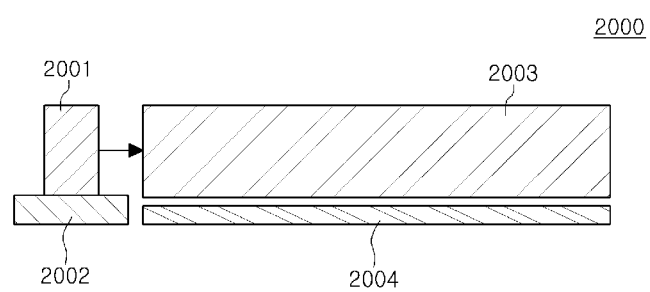
FIG. 8 is a schematic cross-sectional view illustrating another example of a backlight including the nanostructure semiconductor light emitting device of FIG. 1.

FIGS. 7 and 8 are schematic views illustrating examples of a backlight unit including a nanostructure semiconductor light emitting device according to an example embodiment in the present disclosure.

Referring to FIG. 7, a backlight unit 1000 may include at least one light source 1001 mounted on a board 1002, and at least one optical sheet 1003 disposed above the light source 1001. The light source 1001 may be the aforementioned nanostructure semiconductor light emitting device or a package including the same.

The light source 1001 in the backlight unit 1000 of FIG. 7 emits light toward a liquid crystal display (LCD) device disposed thereabove, whereas a light source 2001 mounted on a board 2002 in a backlight unit 2000 according to another embodiment illustrated in FIG. 8 emits light laterally and the light is incident to a light guide plate 2003 such that the backlight unit 2000 may serve as a surface light source. The light travelling to the light guide plate 2003 may be emitted upwardly and a reflective layer 2004 may be disposed below a lower surface of the light guide plate 2003 in order to improve light extraction efficiency.

Figure 9:
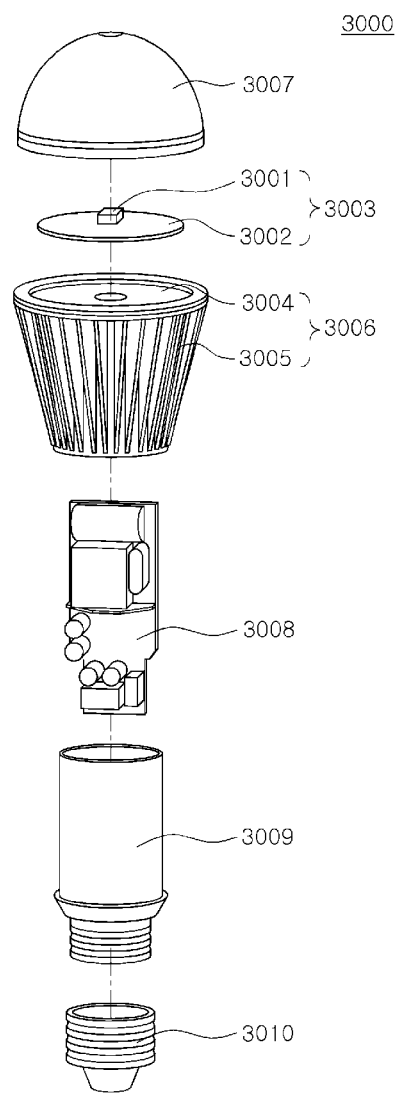
FIG. 9 is a view illustrating an example of a lighting device including the nanostructure semiconductor light emitting device of FIG. 1.

FIG. 9 is an exploded perspective view illustrating an example of a lighting device including a nanostructure semiconductor light emitting device according to an example embodiment in the present disclosure.

A lighting device 3000 illustrated in FIG. 9 is exemplified as a bulb-type lamp, and may include a light emitting module 3003, a driver 3008, and an external connector 3010.

Also, the lighting device 3000 may further include exterior structures such as an external housing 3006, an internal housing 3009, and a cover 3007. The light emitting module 3003 may include a light source 3001 having the above-described package structure or a structure similar thereto, and a circuit board 3002 on which the light source 3001 is mounted. For example, the first and the second electrodes of the above-described semiconductor light emitting device may be electrically connected to electrode patterns of the circuit board 3002. According to an example embodiment, a single light source is mounted on the circuit board 3002 by way of example; however, a plurality of light sources may be mounted on the circuit board, if necessary.

The external housing 3006 may serve as a heat radiator, and may include a heat sink plate 3004 directly contacting the light emitting module 3003 to thereby improve heat dissipation and heat radiating fins 3005 surrounding a side surface of the lighting device 3000. The cover 3007 may be disposed above the lighting module 3003 and may have a convex lens shape. The driver 3008 may be disposed inside the internal housing 3009 and be connected to the external connector 3010 such as a socket structure to receive power from an external power source. Also, the driver 3008 may convert the received power into power appropriate for driving the light source 3001 of the lighting module 3003 and supply the converted power thereto. For example, the driver 3008 may be provided as an AC-DC converter, a rectifying circuit, or the like.

Figure 10:
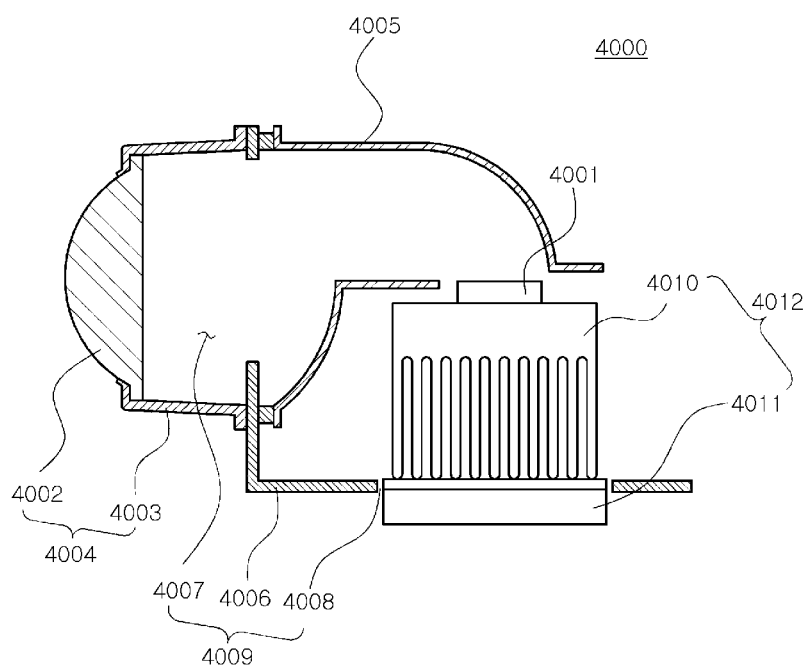
FIG. 10 is a view illustrating an example of a headlamp including the nanostructure semiconductor light emitting device of FIG. 1.

FIG. 10 is a view illustrating an example of a headlamp including a nanostructure semiconductor light emitting device according to an example embodiment in the present disclosure.

Referring to FIG. 10, a headlamp 4000 used in a vehicle or the like may include a light source 4001, a reflector 4005 and a lens cover 4004, and the lens cover 4004 may include a hollow guide part 4003 and a lens 4002. The light source 4001 may include the aforementioned nanostructure semiconductor light emitting device or the aforementioned package having the same.

The headlamp 4000 may further include a heat radiator 4012 externally dissipating heat generated in the light source 4001. The heat radiator 4012 may include a heat sink 4010 and a cooling fan 4011 in order to effectively dissipate heat. In addition, the headlamp 4000 may further include a housing 4009 allowing the heat radiator 4012 and the reflector 4005 to be fixed thereto and supporting them. The housing 4009 may include a body 4006 and a central hole 4008 formed in one surface thereof, to which the heat radiator 4012 is coupled.

The housing 4009 may include a forwardly open hole 4007 formed in the other surface thereof integrally connected to one surface thereof and bent in a direction perpendicular thereto. The reflector 4005 may be fixed to the housing 4009, such that light generated in the light source 4001 may be reflected by the reflector 4005, pass through the forwardly open hole 4007, and be emitted outwards.

As set forth above, according to example embodiments in the present disclosure, the leakage current occurring in the active layers formed on the tip portions of the light emitting nanostructures may be reduced or prevented. Also, an increase in the operating voltage of the light emitting nanostructures may be reduced or prevented.

Additionally, each of the features described above may be combined in any appropriate manner to obtain nanostructure semiconductor light emitting devices, light emitting nanostructures, methods, and/or apparatuses with various combinations of features. In this regard, U.S. application Ser. No. 14/551,978, filed Nov. 24, 2014; Ser. No. 14/723,869, filed May 28, 2015; Ser. No. 13/599,430, filed Aug. 30, 2012; and Ser. No. 14/501,232, filed Sep. 30, 2014, are each hereby incorporated by reference in their entirety, thereby disclosing additional nanostructure semiconductor light emitting devices, light emitting nanostructures, methods, and/or apparatuses with various additional combinations of features.

While example embodiments have been shown and described above, it will be apparent to those skilled in the art that modifications and variations could be made without departing from the scope in the present invention as defined by the appended claims.

What is claimed is:

1. A nanostructure semiconductor light emitting device, comprising:
a base layer having first and second regions and of a first conductivity-type semiconductor material;
a plurality of light emitting nanostructures on an upper surface of the base layer, each of which including a nanocore of the first conductivity-type semiconductor material, and an active layer and a second conductivity-type semiconductor layer sequentially on the nanocore; and
a contact electrode on the plurality of light emitting nanostructures,
wherein tip portions of light emitting nanostructures on the first region are not covered with the contact electrode, and
tip portions of light emitting nanostructures on the second region are covered with the contact electrode.

2. The nanostructure semiconductor light emitting device of claim 1, wherein the light emitting nanostructures on the second region and the contact electrode include a current blocking layer therebetween.

3. The nanostructure semiconductor light emitting device of claim 2, wherein the current blocking layer extends to cover an upper portion of the base layer.

4. The nanostructure semiconductor light emitting device of claim 2, wherein the current blocking layer is of an insulating material including $SiO_2$, SiN, $Al_2O_3$, HfO, $TiO_2$, or ZrO.

5. The nanostructure semiconductor light emitting device of claim 1, further comprising a second electrode on the second region.

6. The nanostructure semiconductor light emitting device of claim 5, wherein the second electrode is configured to contact the contact electrode.

7. The nanostructure semiconductor light emitting device of claim 1, wherein the contact electrode electrically connects the light emitting nanostructures on the first region to the light emitting nanostructures on the second region.

8. The nanostructure semiconductor light emitting device of claim 1, wherein a side surface of the nanocore has a crystal plane perpendicular to the upper surface of the base layer.

9. The nanostructure semiconductor light emitting device of claim 8, wherein the side surface of the nanocore is a non-polar plane.

10. The nanostructure semiconductor light emitting device of claim 1, wherein the tip portions of the light emitting nanostructures have non-planar surfaces, and
the tip portions and side surfaces of the light emitting nanostructures include crystal planes having different polarities.

11. The nanostructure semiconductor light emitting device of claim 1, further comprising an insulating layer on the base layer and having openings, each of which exposing a portion of the base layer,
wherein the nanocore is on the portion of the base layer exposed through the opening.

12. The nanostructure semiconductor light emitting device of claim 1, further comprising an insulating protective layer filling a space between the plurality of light emitting nanostructures.

13. The nanostructure semiconductor light emitting device of claim 12, wherein the insulating protective layer is on the first region.

14. The nanostructure semiconductor light emitting device of claim 12, wherein the insulating protective layer is formed of a material including at least one of $SiO_2$, $SiN_x$, tetraethyl orthosilicate (TEOS), borophosphosilicate glass (BPSG), CVD-$SiO_2$, spin-on glass (SOG), and spin-on dielectric (SOD).

15. A nanostructure semiconductor light emitting device, comprising:
- a base layer of a first conductivity-type semiconductor material;
- a plurality of light emitting nanostructures on the base layer, each of which including a nanocore of the first conductivity-type semiconductor material, and an active layer and a second conductivity-type semiconductor layer sequentially on the nanocore;
- a contact electrode on the plurality of light emitting nanostructures;
- a first electrode electrically connected to the base layer; and
- a second electrode configured to cover one region of the contact electrode, wherein one region of the contact electrode covers tip portions of some light emitting nanostructure among the plurality of light emitting nanostructures, and
- the other region of the contact electrode exposes tip portions of the other light emitting nanostructures among the plurality of light emitting nanostructures.

16. A nanostructure semiconductor light emitting device, comprising:
- a base layer including first and second regions;
- a plurality of light emitting nanostructures on an upper surface of the base layer; and
- a contact electrode on the plurality of light emitting nanostructures,
- wherein tip portions of a first subset of the plurality of light emitting nanostructures in the first region are not covered with the contact electrode, and
- tip portions of a second subset of the plurality of light emitting nanostructures in the second region are covered with the contact electrode.

17. The nanostructure semiconductor light emitting device of claim 16, further comprising:
- a current blocking layer between the contact electrode and the plurality of light emitting nanostructures in the second region.

18. The nanostructure semiconductor light emitting device of claim 17, further comprising:
- a second electrode on the current blocking layer on the plurality of light emitting nanostructures in the second region.

19. The nanostructure semiconductor light emitting device of claim 18, wherein the second electrode is configured to contact the contact electrode.

20. The nanostructure semiconductor light emitting device of claim 16, wherein the contact electrode covers main portions of both the first subset of the plurality of light emitting nanostructures in the first region and the second subset of the plurality of light emitting nanostructures in the second region.

* * * * *